(12) United States Patent
Shono et al.

(10) Patent No.: US 7,932,527 B2
(45) Date of Patent: Apr. 26, 2011

(54) LIGHT-EMITTING DEVICE AND ILLUMINATOR

(75) Inventors: Masayuki Shono, Hirakata (JP); Masayuki Hata, Kadoma (JP)

(73) Assignee: Sanyo Electric Co., Ltd., Osaka (JP)

( * ) Notice: Subject to any disclaimer, the term of this patent is extended or adjusted under 35 U.S.C. 154(b) by 939 days.

(21) Appl. No.: 11/475,186

(22) Filed: Jun. 27, 2006

(65) Prior Publication Data
US 2006/0237739 A1 Oct. 26, 2006

Related U.S. Application Data

(62) Division of application No. 10/807,161, filed on Mar. 24, 2004, now Pat. No. 7,078,735.

(30) Foreign Application Priority Data

Mar. 27, 2003 (JP) .................................. 2003-088487

(51) Int. Cl.
*H01L 33/00* (2010.01)
(52) U.S. Cl. ........................................... 257/98; 257/99
(58) Field of Classification Search .................... 257/98, 257/99
See application file for complete search history.

(56) References Cited

U.S. PATENT DOCUMENTS

| | | | |
|---|---|---|---|
| 5,317,170 A * | 5/1994 | Paoli ............................... | 257/88 |
| 5,406,573 A | 4/1995 | Ozbay et al. | |
| 5,535,230 A | 7/1996 | Abe | |
| 5,955,749 A | 9/1999 | Joannopoulos et al. | |
| 6,711,200 B1 | 3/2004 | Scherer et al. | |
| 6,768,256 B1 | 7/2004 | Fleming et al. | |
| 6,803,603 B1 | 10/2004 | Nitta et al. | |
| 6,825,982 B1 | 11/2004 | Ting | |
| 6,888,864 B1 * | 5/2005 | Kawanishi et al. ........ | 372/43.01 |
| 6,906,459 B2 | 6/2005 | Suehiro et al. | |
| 6,936,854 B2 | 8/2005 | Iwasaki et al. | |
| 6,987,613 B2 * | 1/2006 | Pocius et al. .................. | 359/565 |
| 7,122,446 B2 | 10/2006 | Nitta et al. | |
| 2003/0141507 A1 | 7/2003 | Krames et al. | |

FOREIGN PATENT DOCUMENTS

| | | |
|---|---|---|
| JP | 61-158605 | 7/1986 |
| JP | 62-184585 | 11/1987 |

(Continued)

OTHER PUBLICATIONS

"Proposal of 2-D Photonic Crystal Light Emitting Diode with Surface Grating," Sep. 2001, p. 791, (in Japanese).

(Continued)

*Primary Examiner* — Douglas M Menz
(74) *Attorney, Agent, or Firm* — McDermott Wiill & Emery LLP

(57) ABSTRACT

A light-emitting device, having high light extraction efficiency, capable of obtaining diffused light is obtained. This light-emitting device comprises a light-emitting diode, a portion, formed on a plane substantially parallel to a light-emitting surface of the light-emitting diode, having a dielectric constant periodically modulated with respect to the in-plane direction of the plane substantially parallel to the light-emitting surface and a member provided on the side of the light-emitting surface of the light-emitting diode for diffusing light emitted from the light-emitting diode.

6 Claims, 7 Drawing Sheets

FOREIGN PATENT DOCUMENTS

| | | |
|---|---|---|
| JP | 5-1598 | 1/1993 |
| JP | 07-282609 | 10/1995 |
| JP | 09-092878 | 4/1997 |
| JP | 2000-284726 | 10/2000 |
| JP | 2000-332351 | 11/2000 |
| JP | 2001-148512 | 5/2001 |
| JP | 2001-189494 | 7/2001 |
| JP | 2001-217466 | 8/2001 |
| JP | 2001-308457 | 11/2001 |
| JP | 2001-358364 | 12/2001 |
| JP | 2003-086849 | 3/2003 |
| WO | WO 02/089218 A2 | 11/2002 |

OTHER PUBLICATIONS

"Highly Directive Light Sources using Two-dimensional Photonic Crystal Slabs", Applied Physics Letters, Dec. 2001, vol. 79, No. 26, pp. 4280-4282.

"Strongly Directional Emission from AlGaAs/GaAs Light-Emitting Diodes" Applied Physics Letters, Nov. 1990, vol. 57, No. 22, pp. 2327-2329.

Japanese Office Action, w/ English translation thereof, issued in Japanese Patent Application No. JP 2004-076413 dated on Sep. 2, 2008.

* cited by examiner

LIGHT-EMITTING DIRECTION

LIGHT-EMITTING DIRECTION

LIGHT-EMITTING
DIRECTION

LIGHT-EMITTING
DIRECTION

US 7,932,527 B2

LIGHT-EMITTING DEVICE AND ILLUMINATOR

RELATED APPLICATIONS

This application is a divisional of U.S. patent application Ser. No. 10/807,161, filed Mar. 24, 2004, now U.S. Pat. No. 7,078,735 which is based on Japanese Patent Application No. JP 2003-088487, filed Mar. 27, 2003 the contents of which are hereby incorporated by reference.

BACKGROUND OF THE INVENTION

1. Field of the Invention

The present invention relates to a light-emitting device and an illuminator, and more particularly, it relates to a light-emitting device including a light-emitting diode and an illuminator employing this light-emitting device.

2. Description of the Background Art

A light-emitting diode mounted with a photonic crystal on its light-emitting surface to be capable of improving efficiency for extracting light emitted from the light-emitting diode is known in general. This type of light-emitting diode is disclosed in "Highly directive light sources using two-dimensional photonic crystal slabs", Applied Physics Letters, December 2001, Vol. 79, No. 26, pp. 4280-4282 or "Strongly directional emission from AlGaAs/GaAs light-emitting diodes", Applied Physics Letters, November 1990, Vol. 57, No. 22, pp. 2327-2329, for example.

FIG. 13 is a sectional view for illustrating the structure of a conventional light-emitting diode mounted with a photonic crystal on its light-emitting surface. The structure of the conventional light-emitting diode having the photonic crystal mounted on the light-emitting surface is now described with reference to FIG. 13.

In the conventional light-emitting diode having the photonic crystal mounted on the light-emitting surface, an n-type cladding layer 202 of n-type AlGaAs, an emission layer 203 of p-type GaAs and a p-type cladding layer 204 of p-type AlGaAs are successively stacked on an n-type GaAs substrate 201, as shown in FIG. 13. Thus, the light-emitting diode has a double heterostructure. Periodically arranged striped (elongated) corrugation having a prescribed width and a prescribed depth are formed on the upper surface of the p-type cladding layer 204. A metal layer 205 of Ag is formed on the upper surface of the p-type cladding layer 204 having the aforementioned corrugation.

In the conventional light-emitting diode, as hereinabove described, the upper surface of the p-type cladding layer 204 is formed with the periodically arranged striped corrugation having the prescribed width and the prescribed depth while the metal layer 205 is formed on the upper surface of the p-type cladding layer 204 having the corrugation, thereby forming a portion having a dielectric constant periodically modulated with respect to the in-plane direction of the p-type cladding layer 204 and the metal layer 205. Thus, the p-type cladding layer 204 can also function as a photonic crystal. Consequently, the light-emitting diode emits light perpendicularly to the light-emitting surface, and extraction efficiency for the emitted light can be improved.

However, the aforementioned conventional light-emitting diode having the photonic crystal mounted on the light-emitting surface emits the light perpendicularly to the light-emitting surface, and hence it is difficult to obtain diffused light suitable for indoor illumination or the like. Therefore, it is disadvantageously difficult to apply the conventional light-emitting diode having the photonic crystal mounted on the light-emitting surface to illumination.

SUMMARY OF THE INVENTION

An object of the present invention is to provide a light-emitting device, having high light extraction efficiency, capable of obtaining diffused light.

Another object of the present invention is to provide an illuminator having high light extraction efficiency.

In order to attain the aforementioned objects, a light-emitting device according to a first aspect of the present invention comprises a light-emitting diode, a portion, formed on a plane substantially parallel to a light-emitting surface of the light-emitting diode, having a dielectric constant periodically modulated with respect to the in-plane direction of the plane substantially parallel to the light-emitting surface and a member provided on the side of the light-emitting surface of the light-emitting diode for diffusing light emitted from the light-emitting diode.

In the light-emitting device according to the first aspect, as hereinabove described, the portion having the dielectric constant periodically modulated with respect to the in-plane direction is formed on the plane substantially parallel to the light-emitting surface of the light-emitting diode so that the light emitted from the light-emitting device can be parallelized perpendicularly to the light-emitting surface, whereby the efficiency for extracting the light from the light-emitting diode can be improved. The member diffusing the light emitted from the light-emitting diode is provided on the side of the light-emitting surface of the light-emitting diode so that the parallel light emitted from the light-emitting device can be diffused into various directions, whereby diffused light can be emitted. Thus, the light-emitting device is improved in light extraction efficiency, and can emit diffused light.

In the aforementioned light-emitting device according to the first aspect, the portion having the periodically modulated dielectric constant may be constituted by periodically arranging materials having different dielectric constants, and the portion having the periodically modulated dielectric constant may consist of a photonic crystal. According to this structure, the portion having the periodically modulated dielectric constant can be easily obtained. The portion having the periodically modulated dielectric constant can be formed by periodically arranging dielectric substances and air or by periodically arranging dielectric substances and vacuums.

In the aforementioned light-emitting device according to the first aspect, the member diffusing the emitted light is preferably conductive. According to this structure, the light-emitting diode and the member diffusing the emitted light can be electrically connected with each other when the light-emitting diode and the member diffusing the emitted light are formed in close contact with each other. Thus, the member diffusing the emitted light can be formed with a part for introducing current into the light-emitting diode, whereby the light-emitting diode may not be directly wired. Consequently, the light-emitting device is easy to assemble. Further, the light-emitting surface may not be wired, whereby no wire blocks the emitted light. Consequently, the intensity of the light emitted from the light-emitting device can be improved.

In the light-emitting device including the aforementioned conductive member diffusing the emitted light, the conductive member diffusing the emitted light is preferably formed to be in contact with a portion of the light-emitting diode provided on the light-emitting side. According to this structure, the light-emitting diode and the member diffusing the emitted light can be easily electrically connected with each other.

In the light-emitting device including the aforementioned conductive member diffusing the emitted light, the conductive member diffusing the emitted light preferably consists of at least one material selected from a group consisting of n-type SiC, n-type AlN and p-type diamond. When made of such a material, the member diffusing the emitted light can also attain excellent thermal conductivity in addition to the conductivity, thereby easily dissipating heat generated in the light-emitting-diode through the member diffusing the emitted light. Consequently, the light-emitting device can be driven with larger current, whereby the intensity of the emitted light can be improved.

In the aforementioned light-emitting device according to the first aspect, the member diffusing the emitted light may be constituted of a lens. According to this structure, the parallel light emitted from the light-emitting diode can be easily converted to diffused light. In this case, the member diffusing the emitted light may include a concave lens. According to this structure, the parallel light emitted from the light-emitting diode can be diffused through the concave lens, whereby the parallel light can be easily converted to diffused light. In this case, the concave lens may include a plano-concave lens having a flat first surface and a concave second surface. The light-emitting device may be arranged in contact with the flat first surface. According to this structure, the light-emitting device and the lens can be easily bonded to each other. In addition, the reflected light can be reduced on the light-emitting surface of the light-emitting device and the flat first surface of the lens as compared with a case of arranging the light-emitting device and the lens separately from each other.

Further, the concave lens may be arranged at ratio of one to a plurality of light-emitting diodes. Further, a plurality of concave lens and light-emitting diodes may be arranged in the form of an array. According to this structure, the sizes of regions for emitting light can be increased. Thus, the light-emitting device can be easily used as a light source for illumination or the like.

In the aforementioned light-emitting device according to the first aspect, the member diffusing the emitted light may include a convex mirror. According to this structure, the parallel light emitted from the light-emitting diode can be reflected and diffused by the convex mirror, whereby the parallel light can be easily converted to diffused light.

In the aforementioned light-emitting device according to the first aspect, the member diffusing the emitted light may include a translucent member dispersively containing a light diffusing agent consisting of substantially transparent particulates. According to this structure, the parallel light emitted from the light-emitting diode can be diffused with the translucent member dispersively containing the light diffusing agent, whereby the parallel light can be easily converted to diffused light.

In the aforementioned light-emitting device according to the first aspect, the member diffusing the emitted light may include a translucent member having fine corrugation at least either on the front surface or on the back surface. According to this structure, the parallel light emitted from the light-emitting diode can be diffused with the translucent member having the fine corrugation, whereby the parallel light can be easily converted to diffused light.

In the light-emitting device including the aforementioned translucent member having the fine corrugation, the interval between adjacent projecting portions in the fine corrugation may be at least about 200 nm and not more than about 2000 nm. When the interval between the adjacent projecting portions is set in this range, the interval corresponds to a value equivalent to or several times the emission wavelength, whereby the light can be diffused by a diffraction effect.

In the light-emitting device including the aforementioned translucent member having the fine corrugation, the interval between adjacent projecting portions in the fine corrugation may be at least about 2 μm and not more than about 100 μm. When the interval between the adjacent projecting portions is set in this range, the light can be refracted by the corrugation to be easily diffused.

The aforementioned light-emitting device according to the first aspect preferably further comprises a fluorescent body provided between the light-emitting surface and the member diffusing the emitted light. According to this structure, the fluorescent body scatters the emitted light, whereby diffused light can be more easily obtained. Further, the wavelength of the light emitted from the light-emitting diode can be converted to a different wavelength, whereby white light suitable for illumination can be obtained when various fluorescent bodies are combined with each other.

In the aforementioned light-emitting device according to the first aspect, the light-emitting diode preferably includes an emission layer, and the emission layer preferably consists of a nitride-based semiconductor. According to this structure, high-energy light can be easily obtained at a short wavelength in the blue to ultraviolet range, whereby the intensity of the emitted light can be improved.

In the aforementioned light-emitting device according to the first aspect, a plurality of light-emitting diodes are preferably arranged in the form of a matrix in plane. According to this structure, the size of a region for emitting the light can be so increased that the light-emitting device can be easily used as a light source for illumination or the like.

In this case, the member diffusing the emitted light preferably includes a lens, and a plurality of such lenses are preferably arranged in the form of a matrix in plane. According to this structure, light emitted from light-emitting diodes arranged in the form of a matrix can be easily diffused.

A light-emitting device according to a second aspect of the present invention comprises a light-emitting diode, a portion, formed on a plane substantially parallel to a light-emitting surface of the light-emitting diode, having a dielectric constant periodically modulated with respect to the in-plane direction of the plane substantially parallel to the light-emitting surface and means provided on the side of the light-emitting surface of the light-emitting diode for diffusing light emitted from the light-emitting diode.

In the light-emitting device according to the second aspect, as hereinabove described, the portion having the dielectric constant periodically modulated with respect to the in-plane direction is formed on the plane substantially parallel to the light-emitting surface of the light-emitting diode so that the light emitted from the light-emitting device can be parallelized perpendicularly to the light-emitting surface, whereby efficiency for extracting the light from the light-emitting-diode can be improved. Further, the means diffusing the light emitted from the light-emitting diode is provided on the side of the light-emitting surface of the light-emitting diode so that the parallel light emitted from the light-emitting device can be diffused in various directions, whereby diffused light can be emitted. Thus, the light-emitting device is improved in light extraction efficiency, and can emit diffused light.

An illuminator according to a third aspect of the present invention comprises a light-emitting device including a light-emitting diode, a portion, formed on a plane substantially parallel to a light-emitting surface of the light-emitting diode, having a dielectric constant periodically modulated with respect to the in-plane direction of the plane substantially parallel to the light-emitting surface and a member provided on the side of the light-emitting surface of the light-emitting diode for diffusing light emitted from the light-emitting diode.

In the illuminator according to the third aspect, as hereinabove described, the portion having the dielectric constant periodically modulated with respect to the in-plane direction is formed on the plane substantially parallel to the light-emitting surface of the light-emitting diode so that the light emitted from the light-emitting device can be parallelized perpendicularly to the light-emitting surface, whereby efficiency for extracting the light from the light-emitting diode can be improved. The member diffusing the light emitted from the light-emitting diode is provided on the side of the light-emitting surface of the light-emitting diode so that the parallel light emitted from the light-emitting device can be diffused into various directions, whereby diffused light can be emitted. Thus, the light-emitting device is improved in light extraction efficiency and can emit diffused light, whereby the illuminator can attain a sufficient quantity of light by employing this light-emitting device as a light source.

The aforementioned illuminator according to the third aspect preferably further comprises a fluorescent body arranged at a prescribed interval from the light-emitting device for converting the light emitted from the light-emitting device to white light. According to this structure, white light suitable for the illuminator can be easily obtained. In this case, the fluorescent body may be formed by mixing fluorescent materials having a plurality of emission colors with each other.

In the aforementioned illuminator according to the third aspect, a plurality of light-emitting diodes constituting the light-emitting device are preferably arranged in the form of a matrix in plane. According to this structure, the size of a region emitting the light can be so increased that the light-emitting device can be easily used as the light source for the illuminator. In this case, the member diffusing the emitted light preferably includes a lens, and a plurality of such lenses are preferably arranged in the form of a matrix in plane. According to this structure, light emitted from light-emitting diodes arranged in the form of a matrix can be easily diffused.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
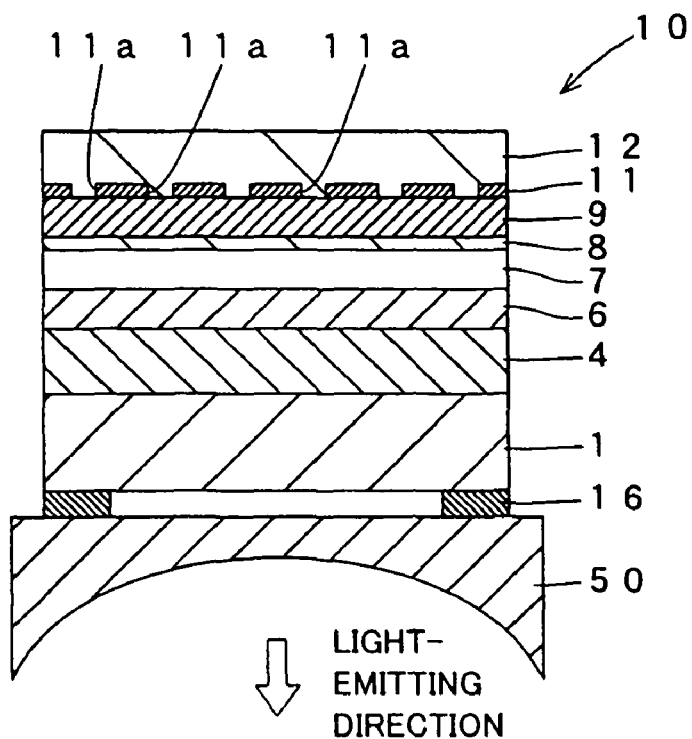
FIG. 1 is a sectional view for illustrating the structure of a light-emitting device according to a first embodiment of the present invention.

Embodiments of the present invention are now described with reference to the drawings.

First Embodiment

The structure of a light-emitting device 10 according to a first embodiment of the present invention is described with reference to FIGS. 1 and 2. The light-emitting device 10 according to the first embodiment includes a light-emitting diode and a plano-concave lens 50.

In the light-emitting diode according to the first embodiment, a single-crystalline GaN layer 4, doped with Si, having a thickness of about 5 µm is formed on the (0001) plane of an n-type GaN substrate 1, doped with oxygen or Si, of about 2 mm square having a thickness of about 200 µm to about 400 µm. An n-type cladding layer 6 of single-crystalline n-type $Al_{0.1}Ga_{0.9}N$, doped with Si, having a thickness of about 0.15 µm is formed on the n-type GaN layer 4. An active layer 7 having a multiple quantum well (MQW) structure obtained by alternately stacking six barrier layers of single-crystalline undoped GaN each having a thickness of about 5 nm and five well layers of single-crystalline undoped $Ga_{0.9}In_{0.1}N$ each having a thickness of about 5 nm is formed on the n-type cladding layer 6. A protective layer 8 of single-crystalline undoped GaN having a thickness of about 10 nm and a p-type cladding layer 9 of single-crystalline p-type $Al_{0.1}Ga_{0.9}N$, doped with Mg, having a thickness of about 0.15 µm are formed on the active layer 7 in this order.

A p-type contact layer 11 of single-crystalline p-type $Ga_{0.95}In_{0.05}N$ having a thickness of about 30 nm is formed on the upper surface of the p-type cladding layer 9. As shown in FIG. 2, the p-type contact layer 11 is formed therein with a plurality of circular through holes 11a, each having a diameter of about 250 nm, arranged in a two-dimensional triangle lattice at an interval (D) of about 380 nm substantially equal to about $4/3^{1/2}$ times the emission wavelength λ in the p-type cladding layer 9. The p-type contact layer 11 having the through holes 11a is an example of the "portion having a dielectric constant periodically modulated with respect to the in-plane direction of said plane substantially parallel to said light-emitting surface" in the present invention.

According to the first embodiment, the interval (D) is designed assuming that the peak emission wavelength λ of light emitted from an emission layer (active layer 7) is about 380 nm and the refractive index of a nitride-based semiconductor is 2.3. While the interval (D) is preferably designed to be about $2/3^{1/2}$ times the emission wavelength λ in the p-type cladding layer 9, precise processing is required in this case. According to the first embodiment, therefore, the interval (D) is designed to correspond to about $4/3^{1/2}$ times the emission wavelength λ in the p-type cladding layer 9, in order to further simplify the processing.

A p-side electrode 12 is formed on the upper surface of the p-type contact layer 11, to fill up the through holes 11a of the p-type contact layer 11. This p-side electrode 12 is constituted of an ohmic electrode layer of about 2 nm in thickness consisting of an Ni layer, a Pd layer or a Pt layer, an oxide transparent electrode layer of indium tin oxide (ITO) having a thickness of about 200 nm, a metal reflecting layer of about 1 μm in thickness consisting of an Al layer, an Ag layer or an Rh layer, a barrier electrode consisting of a Pt layer or a Ti layer and a pad electrode consisting of an Au layer or an Au—Sn layer in ascending order.

An n-side electrode 16 is formed on a region of about 50 μm in width along the outer peripheral portion of the back surface of the n-type GaN substrate 1. The n-side electrode 16 is constituted of an ohmic electrode layer consisting of an Al layer, a barrier electrode consisting of a Pt layer or a Ti layer and a pad electrode consisting of an Au layer or an Au—Sn layer successively from the side closer to the back surface of the n-type GaN substrate 1. The light-emitting diode of the light-emitting device 10 according to the first embodiment has the aforementioned structure.

The plano-concave lens 50 consisting of a material such as n-type SiC, n-type AlN or p-type diamond having excellent thermal conductivity and electrical conductivity is welded to the back surface of the aforementioned light-emitting diode. This plano-concave lens 50 is welded to the n-side electrode 16 while directing the planar side thereof toward the n-type GaN substrate 1. The plano-concave lens 50 is an example of the "member for diffusing light emitted from said light-emitting diode" or "means for diffusing light emitted from said light-emitting diode" in the present invention. The aforementioned light-emitting diode and the plano-concave lens 50 constitute the light-emitting device 10 according to the first embodiment shown in FIG. 1.

In order to form an illuminator with the light-emitting device 10 according to the first embodiment, the upper surface of the p-side electrode 12 of the aforementioned light-emitting diode is welded to a submount (heat sink: not shown). In this case, the back surface of the n-type GaN substrate 1 formed with the n-side electrode 16 serves as a light-emitting surface emitting light along arrow in FIG. 1.

A process of fabricating the light-emitting device 10 according to the first embodiment is described with reference to FIG. 1. First, the n-type GaN substrate 1, doped with oxygen or Si, of about 2 mm square having the thickness of about 200 μm to about 400 μm is prepared. The single-crystalline n-type GaN layer 4, doped with Si, having the thickness of about 5 μm is grown on the (0001) Ga plane of the n-type GaN substrate 1, held at a temperature of about 1000° C. to about 1200° C., by MOVPE (metal organic vapor phase epitaxy) with carrier gas consisting of an $H_2/N_2$ gas mixture containing about 50% of $H_2$, source gas consisting of $NH_3$ and trimethyl gallium (TMGa) and dopant gas consisting of $SiH_4$ at a growth rate of about 3 μm/h.

Then, the n-type cladding layer 6 of single-crystalline n-type $Al_{0.1}Ga_{0.9}N$, doped with Si, having the thickness of about 0.15 μm is grown on the n-type GaN layer 4 with carrier gas consisting of an $H_2/N_2$ gas mixture containing about 1% to about 3% of $H_2$, source gas consisting of $NH_3$, TMGa and trimethyl aluminum (TMAl) and dopant gas consisting of $SiH_4$ at a growth rate of about 3 μm/h. while keeping the temperature of the n-type GaN substrate 1 at about 1000° C. to about 1200° C., preferably at about 1150° C.

Then, the active layer 7 having the MQW structure obtained by alternately stacking the six barrier layers of single-crystalline undoped GaN each having the thickness of about 5 nm and the five well layers of single-crystalline undoped $Ga_{0.9}In_{0.1}N$ each having the thickness of about 5 nm is formed on the n-type cladding layer 6 with carrier gas consisting of an $H_2/N_2$ gas mixture containing about 1% to about 5% of $H_2$ and source gas consisting of $NH_3$, triethyl gallium (TEGa) and trimethyl indium (TMIn) at a growth rate of about 0.4 nm/s while keeping the temperature of the n-type GaN substrate 1 at about 700° C. to about 1000° C., preferably at about 850° C. In continuation, the protective layer 8 of single-crystalline undoped GaN having the thickness of about 10 nm is grown at a growth rate of about 0.4 nm/s.

Then, the p-type cladding layer 9 of single-crystalline p-type $Al_{0.1}Ga_{0.9}N$, doped with Mg, having the thickness of about 0.15 μm is grown on the protective layer 8 with carrier gas consisting of an $H_2/N_2$ gas mixture containing about 1% to about 3% of $H_2$, source gas consisting of $NH_3$, TMGa and TMAl and dopant gas consisting of biscyclopentadienyl magnesium ($Cp_2Mg$) at a growth rate of about 3 μm/h while keeping the temperature of the n-type GaN substrate 1 at about 1000° C. to about 1200° C., preferably at about 1150° C.

Then, cylindrical SiN layers (not shown) of about 250 nm in diameter arranged in a two-dimensional triangle lattice at an interval of about 380 nm substantially equal to about $4/3^{1/2}$ times the emission wavelength λ in the p-type cladding layer 9 are formed by lithography employing electron beam or the like and etching. In other words, the cylindrical SiN layers are formed on positions to be formed with the through holes 11a shown in FIG. 2. The SiN layers are employed as masks for growing the p-type contact layer 11 of single-crystalline p-type $Ga_{0.95}In_{0.05}N$ having the thickness of about 30 nm on the p-type cladding layer 9 by MOVPE. At this time, the p-type contact layer 11 is formed with carrier gas consisting of an $H_2/N_2$ gas mixture containing about 1% to about 5% of $H_2$, source gas consisting of $NH_3$. TMGa and TMIn and dopant gas consisting of $Cp_2Mg$ at a growth rate of about 0.4 nm/s while keeping the temperature of the GaN substrate 1 at about 700° C. to about 1000° C., preferably at about 850° C.

The p-type cladding layer 9 and the p-type contact layer 11 are so formed under the condition setting the hydrogen concentration of the carrier gas to the low level ($H_2$ content: about 1% to about 5%) as to activate the Mg dopant with no heat treatment in an $N_2$ atmosphere. Thus, the p-type cladding layer 9 and the p-type contact layer 11 can be formed as p-type semiconductor layers having high carrier concentrations. Thereafter the SiN layers (not shown) are removed from the p-type cladding layer 9, thereby forming the through holes 11a in the p-type contact layer 11 as shown in FIG. 2.

Thereafter the ohmic electrode layer of about 2 nm in thickness consisting of the Ni layer, the Pd layer or the Pt layer, the oxide transparent electrode layer of ITO having the thickness of about 200 nm, the metal reflecting layer of about 1 μm in thickness consisting of the Al layer, the Ag layer or the Rh layer, the barrier electrode consisting of the Pt layer or the Ti layer and the pad electrode consisting of the Au layer or the Au—Sn layer are successively formed on the upper surface of the p-type contact layer 11 by vacuum evaporation or the like to fill up the through holes 11a of the p-type contact layer 11, thereby forming the p-side electrode 12. Further, the ohmic electrode layer consisting of the Al layer, the barrier electrode consisting of the Pt layer or the Ti layer and the pad electrode consisting of the Au layer or the Au—Sn layer are successively formed on the region of about 50 μm in width along the outer peripheral portion of the back surface of the n-type GaN substrate 1 by vacuum evaporation or the like, thereby forming the n-side electrode 16. The light-emitting diode of the light-emitting device 10 according to the first embodiment is formed in the aforementioned manner.

Finally, the plano-concave lens 50 consisting of the material such as n-type SIC, n-type AlN or p-type diamond having excellent thermal conductivity and electrical conductivity is welded to the back surface of the n-type GaN substrate 1 through the n-side electrode 16 while directing the planar side of the plano-concave lens 50 toward the n-type GaN substrate 1. The light-emitting device 10 according to the first embodiment is formed in the aforementioned manner.

According to the first embodiment, as hereinabove described, the interval D (see FIG. 2) between the through holes 11a of the p-type contact layer 11 is set to about $4/3^{1/2}$ times the emission wavelength λ in the p-type cladding layer 9 while filling up the aforementioned through holes 11a with the ohmic electrode layer and the oxide transparent electrode layer constituting the p-side electrode 12, whereby the p-type contact layer 11 can function as a two-dimensional photonic crystal having a dielectric constant periodically modulated with respect to the in-plane direction. Further, the p-type contact layer 11 having the aforementioned structure is so formed on the plane parallel to the back surface of the GaN substrate 1 serving as the light-emitting surface of the light-emitting diode that the light emitted from the light-emitting diode is parallelized perpendicularly to the light-emitting surface, whereby light extraction efficiency can be improved. In addition, the plano-concave lens 50 is so provided on the aforementioned light-emitting surface that the parallel light emitted in the direction perpendicular to the aforementioned light-emitting surface can be easily diffused into various directions by the concave surface of the plano-concave lens 50. Consequently, the light-emitting diode can be improved in light extraction efficiency, and can emit diffused light.

According to the first embodiment, the plano-concave lens 50 is made of the material such as n-type SiC, n-type AlN or p-type diamond having excellent thermal conductivity so that heat generated in the light-emitting diode can be easily dissipated. Consequently, the light-emitting device 10 can be driven with larger current, whereby the intensity of the emitted light can be improved. When a radiation part such as a radiation fin is mounted on the plano-concave lens 50, the heat can be further easily dissipated.

According to the first embodiment, further, the plano-concave lens 50 is made of the material such as n-type SiC having electrical conductivity while the n-side electrode 16 of the light-emitting diode is formed in close contact with the plano-concave lens 50, whereby the light-emitting diode and the plano-concave lens 50 can be electrically connected with each other. Thus, the plano-concave lens 50 can be formed with the electrode of the light-emitting diode, whereby the light-emitting diode may not be directly wired. Therefore, the light-emitting diode is so easy to assemble that reliability thereof can be improved. Further, the light-emitting surface may not be wired so that no wire blocks the emitted light. Consequently, the intensity of the light emitted from the light-emitting diode can be improved.

When the thickness of the ohmic electrode layer constituting the p-side electrode 12 is reduced in the first embodiment, light absorption can be reduced. Further, the oxide transparent electrode layer constituting the p-side electrode 12 can inhibit the ohmic electrode layer and the metal reflecting layer constituting the p-side electrode 12 from reacting with each other. In addition, the barrier electrode constituting the p-side electrode 12 can inhibit the metal reflecting layer and the pad electrode constituting the p-side electrode 12 from reacting with each other. Further, the barrier electrode constituting the n-side electrode 16 can inhibit the ohmic electrode layer and the pad electrode constituting the n-side electrode 16 from reacting with each other.

Second Embodiment

Figure 3:
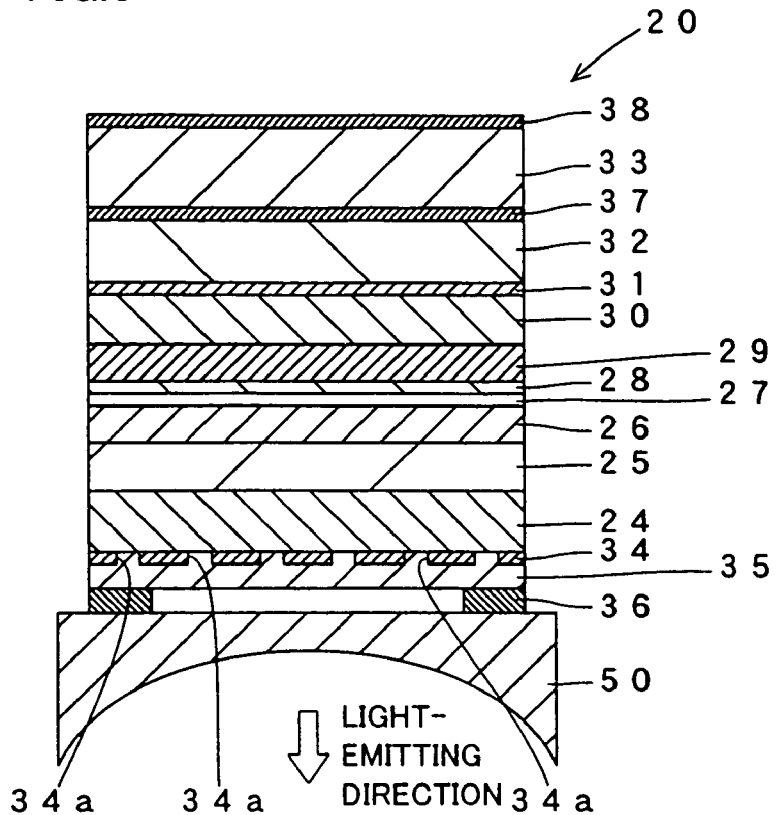
FIG. 3 is a sectional view for illustrating the structure of a light-emitting device according to a second embodiment of the present invention.
Figure 4:
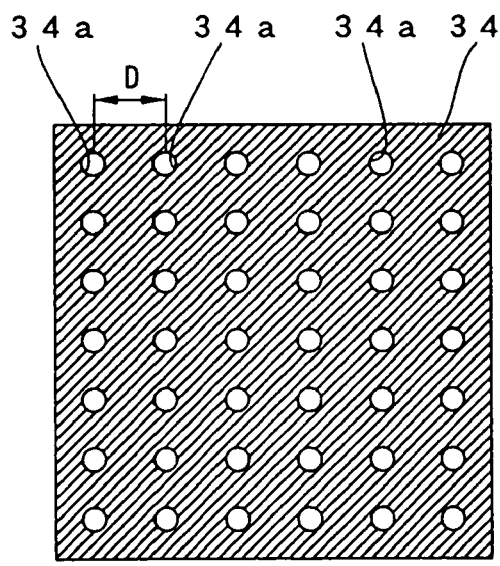
FIG. 4 is a top plan view for illustrating the planar structure of a metal contact layer according to the second embodiment of the present invention.

Referring to FIGS. 3 and 4, a light-emitting device 20 according to a second embodiment of the present invention is formed with a portion (two-dimensional photonic crystal) having a periodically modulated dielectric constant on the back surface (light-emitting surface), dissimilarly to the aforementioned first embodiment. The light-emitting device 20 according to the second embodiment includes a light-emitting diode and a plano-concave lens 50.

In the light-emitting diode of the light-emitting device 20 according to the second embodiment, an n-type multilayer reflector 25 obtained by alternately stacking 10 single-crystalline n-type $Al_{0.2}Ga_{0.8}N$ layers, doped with Si, each having a thickness of about 40 nm and 10 single-crystalline n-type GaN layers, doped with Si, each having a thickness of about 40 nm is formed on the upper surface of a single-crystalline n-type GaN layer 24 doped with Si. An n-type cladding layer 26 of single-crystalline n-type $Al_{0.1}Ga_{0.9}N$, doped with Si, having a thickness of about 0.15 μm is formed on the n-type multilayer reflector 25. A single quantum well (SQW) active layer 27 having an SQW structure consisting of a single-crystalline undoped $Ga_{0.8}In_{0.2}N$ well layer having a thickness of about 5 nm is formed on the n-type cladding layer 26.

A protective layer 28 of single-crystalline undoped GaN having a thickness of about 10 nm and a p-type cladding layer 29 of single-crystalline p-type $Al_{0.1}Ga_{0.9}N$, doped with Mg, having a thickness of about 0.15 μm are formed on the SQW active layer 27 in this order. A p-type multilayer reflector 30 obtained by alternately stacking 10 single-crystalline p-type $Al_{0.2}Ga_{0.8}N$ layers, doped with Mg, each having a thickness of about 40 nm and 10 single-crystalline p-type GaN layers, doped with Mg, each having a thickness of about 40 nm is formed on the p-type cladding layer 29. A p-type contact layer 31 of single-crystalline p-type $Ga_{0.95}In_{0.05}N$, doped with Mg, having a thickness of about 30 nm is formed on the p-type multilayer reflector 30.

A p-side electrode 32 is formed on the upper surface of the p-type contact layer 31. This p-side electrode 32 is constituted of an ohmic electrode layer of about 2 nm in thickness consisting of an Ni layer, a Pd layer or a Pt layer, an oxide transparent electrode layer of ITO having a thickness of about 200 nm, a metal reflecting layer of about 1 μm in thickness consisting of an Al layer, an Ag layer or an Rh layer, a barrier electrode consisting of a Pt layer or a Ti layer and a pad electrode consisting of an Au layer or an Au—Sn layer in ascending order.

A support substrate 33 having a thickness of about 200 μm to about 1 mm is formed on the upper surface of the p-side electrode 32. This support substrate 33 consists of a p-type diamond substrate, an n-type SiC substrate or a polycrystalline AlN substrate. Electrodes 37 and 38 each consisting of an Al layer, a Pt payer and an Au layer successively stacked from the side closer to the support substrate 33 are formed on the front and back surfaces of the support substrate 33 respectively. The support substrate 33 is bonded to the p-side electrode 32 through the electrode 37.

According to the second embodiment, a metal layer 34 of Al having a thickness of about 50 nm is formed on the back surface of the n-type GaN layer 24. As shown in FIG. 4, the metal layer 34 is formed therein with a plurality of circular through holes 34a, each having a diameter of about 120 nm, arranged in a two-dimensional square lattice at an interval (D) of about 190 nm substantially equal to the emission wavelength λ in the p-type cladding layer 29. The metal layer 34 having the through holes 34a is an example of the "portion having a dielectric constant periodically modulated with respect to the in-plane direction of said plane substantially parallel to said light-emitting surface" in the present invention. The interval (D) is designed assuming that the peak emission wavelength λ of light emitted from an emission layer (SQW active layer 27) is about 440 nm and the refractive index of a nitride-based semiconductor is 2.3. An n-side electrode 35 consisting of an oxide transparent conductive film such as an ITO film is formed on the back surface of the metal layer 34, to fill up the through holes 34a of the metal layer 34. A pad electrode 36 consisting of an Au layer or an Au—Sn layer is formed on a region of about 50 μm in width along the outer peripheral portion of the back surface of the n-side electrode 35. The light-emitting diode of the light-emitting device 20 according to the second embodiment has the aforementioned structure.

According to the second embodiment, the plano-concave lens 50 of a material such as n-type SiC, n-type AlN or p-type diamond having excellent thermal conductivity and electrical conductivity is welded to the back surface of the pad electrode 36 of the light-emitting diode while directing the planar side thereof toward the n-side electrode 35. The plano-concave lens 50 is an example of the "member for diffusing light emitted from said light-emitting diode" or "means for diffusing light emitted from said light-emitting diode" in the present invention. The aforementioned light-emitting diode and the plano-concave lens 50 constitute the light-emitting device 20 according to the second embodiment shown in FIG. 3.

In the aforementioned light-emitting device 20 according to the second embodiment, the back surface of the n-side electrode 35 serves as a light-emitting surface emitting light along arrow in FIG. 3.

A process of fabricating the light-emitting device 20 according to the second embodiment is described with reference to FIGS. 3 to 5.

Figure 5:
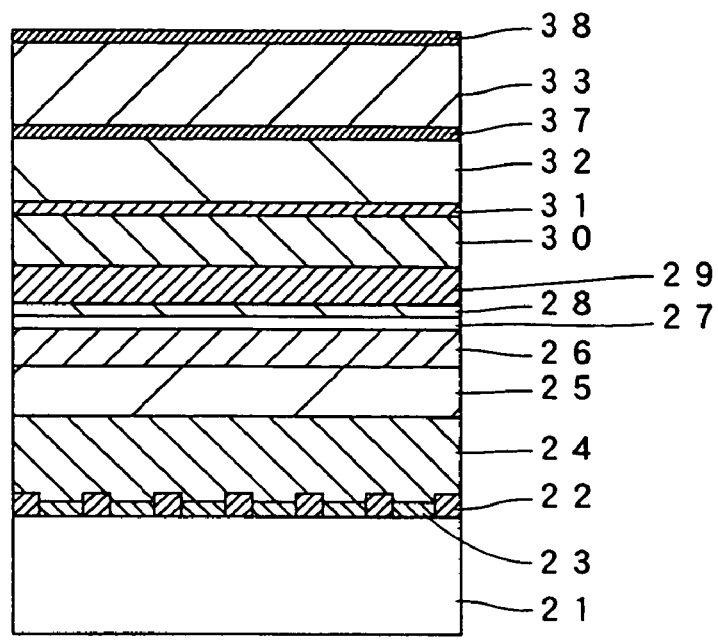
FIG. 5 is a sectional view for illustrating a process of fabricating the light-emitting device according to the second embodiment shown in FIG. 3.

First, a semiconductor substrate 21 of GaP, GaAs or Si having a surface consisting of a (111) plane (or a Ga plane) is prepared as shown in FIG. 5. A selective growth mask 22 of $SiO_2$ or $SiN_x$ interspersedly having striped openings or hexagonal or circular openings is formed on the upper surface of the semiconductor substrate 21. N-type low-temperature buffer layers 23 of non-single-crystalline n-type GaN, AlGaN or AlN, doped with Si, having a thickness of about 10 nm to about 50 nm are formed on surface portions of the semiconductor substrate 21 exposed between the openings of the selective growth mask 22 with source gas consisting of $NH_3$, TMGa and TMAl and dopant gas of $SiH_4$ while keeping the temperature of the semiconductor substrate 21 at about 400° C. to about 700° C.

Then, the n-type GaN layer 24 is grown on the n-type low-temperature buffer layers 23 with carrier gas consisting of an $H_2/N_2$ gas mixture containing about 50% of $H_2$, source gas consisting of $NH_3$ and TMGa and dopant gas consisting of $SiH_4$ at a growth rate of about 3 μm/h while keeping the temperature of the semiconductor substrate 21 at about 1000° C. to about 1200° C., preferably at about 1150° C.

Then, the n-type multilayer reflector 25 obtained by alternately stacking the 10 single-crystalline n-type $Al_{0.2}Ga_{0.8}N$ layers, doped with Si, each having the thickness of about 40 nm and the 10 single-crystalline n-type GaN layers, doped with Si, each having the thickness of about 40 nm is grown on the n-type GaN layer 24 with carrier gas consisting of an $H_2/N_2$ gas mixture containing about 1% to about 3% of $H_2$, source gas consisting of $NH_3$, TMGa and TMAl and dopant gas consisting of $SiH_4$ at a growth rate of about 3 μm/h while keeping the temperature of the semiconductor substrate 21 at about 1000° C. to about 1200° C., preferably at about 1150° C.

Then, the n-type cladding layer 26 of single-crystalline n-type $Al_{0.1}Ga_{0.9}N$, doped with Si, having the thickness of about 0.15 μm is formed on the n-type multilayer reflector 25 with carrier gas consisting of an $H_2/N_2$ gas mixture containing about 1% to about 3% of $H_2$, source gas consisting of $NH_3$, TMGa and TMAl and dopant gas consisting of $SiH_4$ at a growth rate of about 3 μm/h while keeping the temperature of the semiconductor substrate 21 at about 1000° C. to about 1200° C., preferably at about 1150° C.

Then, the SQW active layer 27 consisting of the single-crystalline undoped $Ga_{0.8}In_{0.2}N$ well layer having the thickness of about 5 nm is formed on the n-type cladding layer 26 with carrier gas consisting of an $H_2/N_2$ gas mixture containing about 1% to about 5% of $H_2$ and source gas consisting of $NH_3$, TEGa and TMIn at a growth rate of about 0.4 nm/s while keeping the temperature of the semiconductor substrate 21 at about 700° C. to about 1000° C., preferably at about 850° C. In continuation, the protective layer 28 of single-crystalline undoped GaN having the thickness of about 10 nm is grown at a growth rate of about 0.4 nm/s.

Then, the p-type cladding layer 29 of single-crystalline p-type $Al_{0.1}Ga_{0.9}N$, doped with Mg, having the thickness of about 0.15 μm is formed on the protective layer 28 with carrier gas consisting of an $H_2/N_2$ gas mixture containing about 1% to about 3% of $H_2$, source gas consisting of $NH_3$, TMGa and TMAl and dopant gas consisting of $Cp_2Mg$ at a growth rate of about 3 μm/h while keeping the temperature of the semiconductor substrate 21 at about 1000° C. to about 1200° C., preferably at about 1150° C.

Then, the p-type multilayer reflector 30 obtained by alternately stacking the 10 single-crystalline p-type $Al_{0.2}Ga_{0.8}N$ layers, doped with Mg, each having the thickness of about 40 nm and the 10 single-crystalline p-type GaN layers, doped with Mg, each having the thickness of about 40 nm is formed on the p-type cladding layer 29 with carrier gas consisting of an $H_2/N_2$ gas mixture containing about 1% to about 3% of $H_2$, source gas consisting of $NH_3$, TMGa and TMAl and dopant gas consisting of $Cp_2Mg$ at a growth rate of about 3 μm/h while keeping the temperature of the semiconductor substrate 21 at about 1000° C. to about 1200° C., preferably at about 1150° C.

The p-type cladding layer 29 and the p-type multilayer reflector 30 are so formed under the condition setting the hydrogen concentration of the carrier gas to the low level ($H_2$ content: about 1% to about 3%) as to activate the Mg dopant with no heat treatment in an $N_2$ atmosphere. Thus, the p-type cladding layer 29 and the p-type multilayer reflector 30 can be formed as p-type semiconductor layers having high carrier concentrations.

Then, a contact layer 31 of undoped single-crystalline $Ga_{0.95}In_{0.05}N$ having a thickness of about 30 nm is formed on the p-type multilayer reflector 30 with carrier gas consisting of an $H_2/N_2$ gas mixture containing about 1% to about 5% of $H_2$ and source gas consisting of $NH_3$, TEGa and TMIn at a growth rate of about 0.4 nm/s while keeping the temperature of the semiconductor substrate 21 at about 700° C. to about 1000° C., preferably at about 850° C.

Then, annealing is performed in an $N_2$ atmosphere while keeping the temperature of the semiconductor substrate 21 at about 400° C. to about 900° C., preferably at about 800° C., thereby desorbing hydrogen from the contact layer 31. Thus, the hydrogen concentration in the contact layer 31 is reduced to not more than about $5\times10^{18}$ $cm^3$. Thereafter Mg is ion-implanted into the contact layer 31 at an implantation rate of about $1\times10^{18}$ $cm^3$ to about $1\times10^{19}$ $cm^3$, and annealing is performed in an $N_2$ atmosphere at about 800° C., thereby converting the contact layer 31 to a p-type layer.

Thereafter the p-side electrode 32 constituted of the ohmic electrode layer of about 2 nm in thickness consisting of the Ni layer, the Pd layer or the Pt layer, the oxide transparent electrode layer of ITO having the thickness of about 200 nm, the metal reflecting layer of about 1 μm in thickness consisting of the Al layer, the Ag layer or the Rh layer, the barrier electrode consisting of the Pt layer or the Ti layer and the pad electrode consisting of the Au layer or the Au—Sn layer in ascending order is formed on the upper surface of the contact layer 31 by vacuum evaporation or the like.

The support substrate 33 of p-type diamond, n-type SiC or AlN, having the thickness of about 1 μm, formed with the electrodes 37 and 38 of Al, Pt and Au on the front and back surfaces respectively is prepared. The support substrate 33 is bonded to the upper surface of the p-side electrode 32 through the electrode 37.

Then, the semiconductor substrate 21 is removed by wet etching or the like, and the selective growth mask 22 and the n-type low-temperature buffer layers 23 are thereafter removed by polishing or the like, thereby exposing the back surface of the n-type GaN layer 24.

As shown in FIG. 3, the metal layer 34 of Al having the thickness of about 50 nm is formed on the exposed back surface of the n-type GaN layer 24 by vacuum evaporation or the like. Thereafter the circular through holes 34a of about 120 nm in diameter arranged in a two-dimensional square lattice at the interval (D) of about 190 nm substantially equal to the emission wavelength λ in the p-type cladding layer 29 are formed in the metal layer 34 as shown in FIG. 4, through a process similar to that for forming the through holes 11a of the p-type contact layer 11 in the aforementioned first embodiment.

Then, the n-side electrode 35 consisting of the oxide transparent conductive film such as an ITO film is formed on the back surface of the metal layer 34, to fill up the through holes 34a of the metal layer 34. The pad electrode 36 consisting of the Au layer or the Au—Sn layer is formed on the region of about 50 μm in width along the outer peripheral portion of the back surface of the n-side electrode 35. The light-emitting diode of the light-emitting device 20 according to the second embodiment is formed in the aforementioned manner.

Then, the plano-concave lens 50 of the material such as n-type SiC, N-type AlN or p-type diamond having excellent thermal conductivity and electrical conductivity is welded to the back surface of the n-side electrode 35 through the pad electrode 36 while directing the planar side toward the n-side electrode 35. Thus, the light-emitting device 20 according to the second embodiment consisting of the light-emitting diode and the piano-concave lens 50 is formed as shown in FIG. 3.

According to the second embodiment, as hereinabove described, the interval D (see FIG. 4) between the through holes 34a of the metal layer 34 is set to be substantially equal to the emission wavelength λ in the p-type cladding layer 29 while filling up the aforementioned through holes 34a with the oxide transparent conductive film constituting the n-side electrode 35, whereby the metal layer 34 can function as a two-dimensional photonic crystal having a dielectric constant periodically modulated with respect to the in-plane direction. Further, the metal layer 34 having the aforementioned structure is so formed on the plane parallel to the back surface of the n-side electrode 35 serving as the light-emitting surface of the light-emitting diode that the light emitted from the light-emitting diode is parallelized perpendicularly to the light-emitting surface, whereby light extraction efficiency can be improved. In addition, the plano-concave lens 50 is so provided on the aforementioned light-emitting surface that the parallel light emitted in the direction perpendicular to the aforementioned light-emitting surface can be easily diffused into various directions. Consequently, the light-emitting device 20 can be improved in light extraction efficiency, and can emit diffused light.

Third Embodiment

Figure 6:
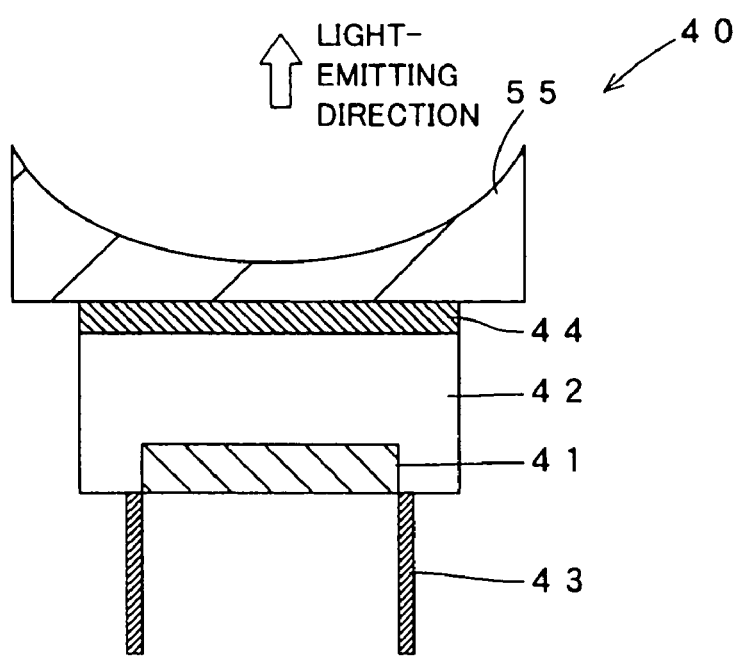
FIG. 6 is a sectional view for illustrating the structure of an illuminator employing a light-emitting device according to a third embodiment of the present invention.

Referring to FIG. 6, a third embodiment of the present invention is described with reference to an illuminator 40 including a light-emitting diode 41 constituting a light-emitting device 10 similar to that according to the first embodiment.

Figure 2:
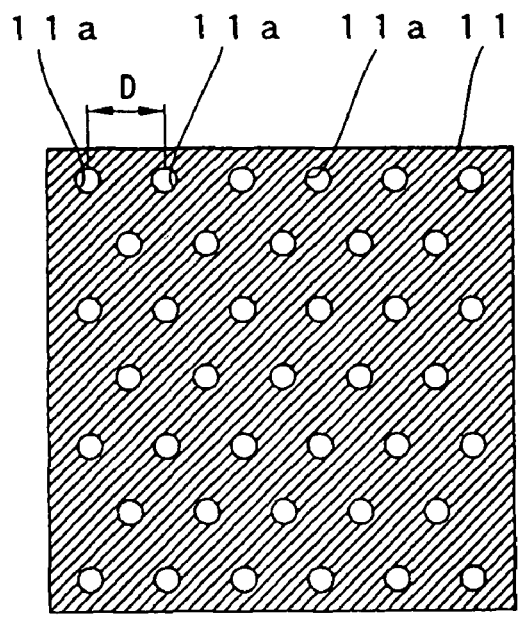
FIG. 2 is a top plan view for illustrating the planar structure of a p-type contact layer according to the first embodiment of the present invention.

The illuminator 40 according to the third embodiment employs the light-emitting diode 41 formed by removing a plano-concave lens 50 from the light-emitting device 10 similar to that according to the first embodiment shown in FIG. 1. The light-emitting diode 41 is bonded to the inner bottom surface of a light-emitting device package 42 of a heat-conductive material such as Cu with a welding material such as Au—Sn solder while directing its light-emitting surface upward. An n-side electrode (not shown) and a p-side electrode (not shown) of the light-emitting diode 41 are electrically connected with terminals 43 of the light-emitting device package 42 by wire bonding.

A fluorescent body 44 is arranged on an upper opening surface of the light-emitting device package 42. An insulating plano-concave lens 55 of glass, quartz or resin is arranged on the upper surface of the fluorescent body 55.

According to the third embodiment, as hereinabove described, the fluorescent body 44 is so set between the light-emitting surface and the plano-concave lens 55 as to scatter light parallelly emitted from the light-emitting diode 41 perpendicularly to the light-emitting surface, whereby diffused light can be easily obtained. Further, the plano-concave lens 55 also diffuses the emitted light, whereby the diffused light can be more easily obtained. The light-emitting diode 41 made of a nitride-based semiconductor emits high-energy light at a short wavelength in the blue to ultraviolet range, for irradiating the fluorescent body 44 with this light. Thus, the wavelength of the emitted light can be efficiently converted to a different wavelength with the fluorescent body 44, whereby white light suitable for illumination can be obtained when various types of fluorescent bodies are with each other.

Fourth Embodiment

Figure 7:
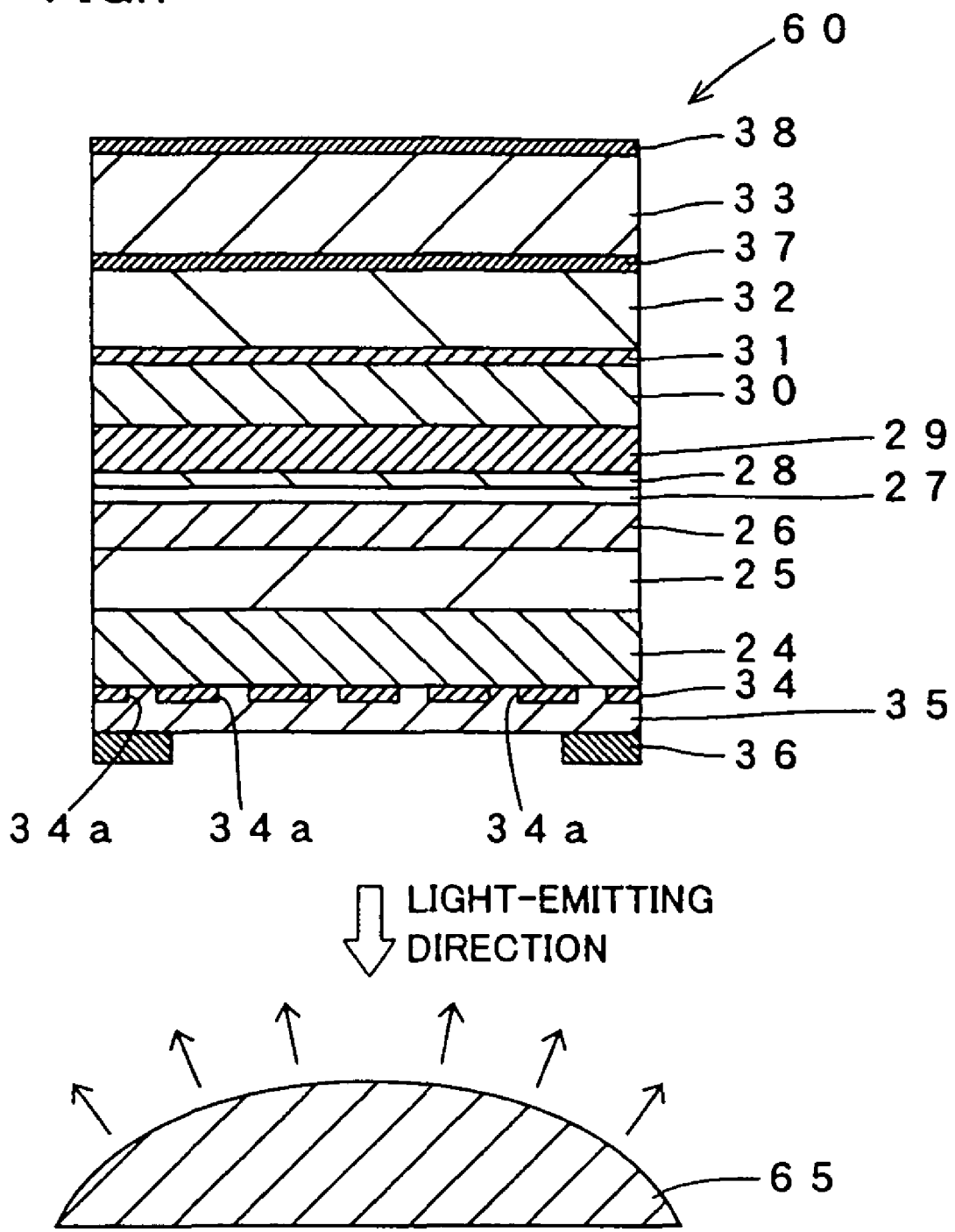
FIG. 7 is a sectional view for illustrating the structure of a light-emitting device according to a fourth embodiment of the present invention.

Referring to FIG. 7, a light-emitting device 60 according to a fourth embodiment of the present invention employs a convex mirror 65 in place of the plano-concave lens 50 employed in the aforementioned second embodiment. The remaining structure of the light-emitting device 60 according to the fourth embodiment is similar to that of the light-emitting device 20 according to the aforementioned second embodiment.

The light-emitting device 60 according to the fourth embodiment is formed by removing a plano-concave lens from a light-emitting device similar to the light-emitting device 20 according to the second embodiment shown in FIG. 3. In other words, a light-emitting diode of the light-emitting device 60 according to the fourth embodiment includes a metal layer 34 functioning as a two-dimensional photonic crystal having a dielectric constant periodically modulated with respect to the in-plane direction. The convex mirror 65 is arranged at a prescribed interval from a light-emitting surface of the light-emitting diode, to be opposed to the light-emitting diode. This convex mirror 65 is formed by coating the convex surface of resin or glass with a reflecting film of Al or Ag. This convex mirror 65 is an example of the "member for diffusing light emitted from said light-emitting diode" or "means for diffusing light emitted from said light-emitting diode" in the present invention.

In the light-emitting device 60 according to the fourth embodiment, the metal layer 34 can function as the two-dimensional photonic crystal having the dielectric constant periodically modulated with respect to the in-plane direction similarly to that in the aforementioned second embodiment, whereby the light emitted from the light-emitting diode can be parallelized perpendicularly to the light-emitting surface. Thus, light extraction efficiency can be improved.

In the light-emitting device 60 according to the fourth embodiment, further, the convex mirror 65 is arranged oppositely to the light-emitting surface of the light-emitting diode as hereinabove described, whereby the light emitted from the light-emitting diode can be reflected and diffused by the convex mirror 65.

Fifth Embodiment

Figure 8:
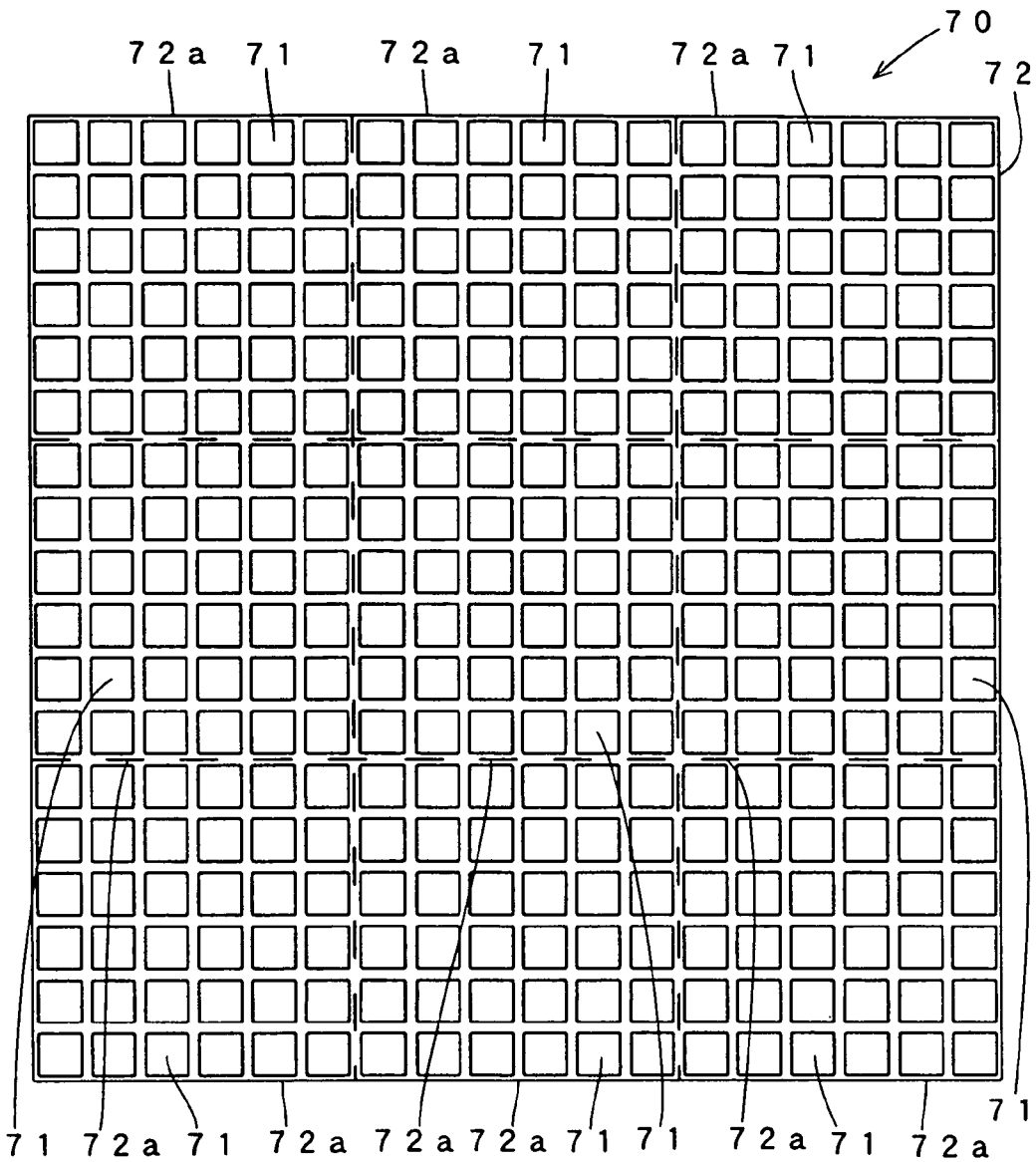
FIG. 8 is a plan view for illustrating the structure of a light-emitting device according to a fifth embodiment of the present invention.
Figure 9:
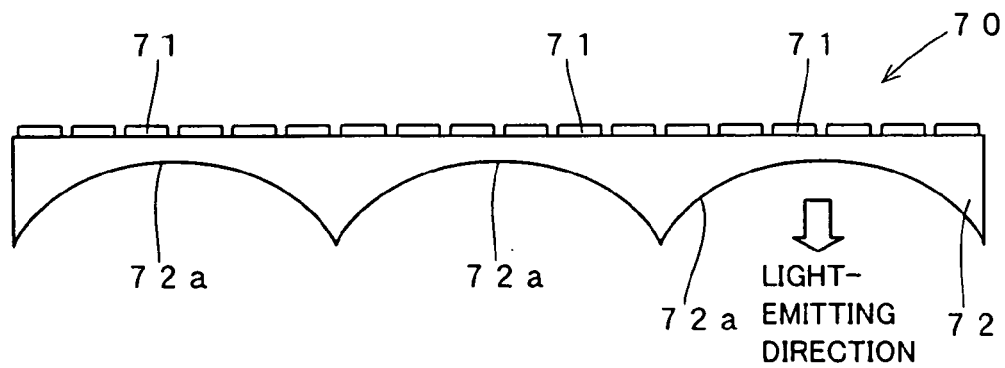
FIG. 9 is a sectional view for illustrating the structure of the light-emitting device according to the fifth embodiment of the present invention.

Referring to FIGS. 8 and 9, plano-concave lenses 72a and light-emitting diodes 71 are two-dimensionally (planarly) arranged in the form of an array (matrix) in a light-emitting device 70 according to a fifth embodiment of the present invention.

In the light-emitting device 70 according to the fifth embodiment, a plurality of light-emitting diodes 71 are arranged on a lens member 72 of polycarbonate, for example, in the form of a matrix (array) in plane, as shown in FIG. 8. More specifically, 324 light-emitting diodes 71 are arranged in the form of a 18 by 18 matrix. Each of the light-emitting diodes 71 has a structure obtained by removing a plano-concave lens from a light-emitting diode similar to that according to the first or second embodiment shown in FIG. 1 or 3. In other words, each of the light-emitting diodes 71 of the light-emitting device 70 according to the fifth embodiment includes a p-type contact layer 11 (see FIG. 1) or a metal layer 34 (see FIG. 3) functioning as a two-dimensional photonic crystal having a dielectric constant periodically modulated with respect to the in-plane direction.

The lens member 72 is constituted of a plurality of plano-concave lenses 72a arranged in the form of a matrix (array) in plane. As shown in FIG. 8, the plano-concave lenses 72a are arranged in the form of a 3 by 3 matrix (9 plano-concave lenses 72a in total). Each plano-concave lens 72a is arranged at a ratio of one to a plurality of (36) light-emitting diodes 71. The planar surfaces of the plano-concave lenses 72a are formed with transparent electrodes of ITO. The transparent electrodes excite the light-emitting diodes 71 through ohmic electrodes of metal. The plano-concave lenses 72a are examples of the "member for diffusing light emitted from said light-emitting diode" or "means for diffusing light emitted from said light-emitting diode" in the present invention.

According to the fifth embodiment, as hereinabove described, the plano-concave lenses 72a and the light-emitting diodes 71 are so two-dimensionally (planarly) arranged in the form of an array (matrix) that the sizes of regions for emitting light can be increased. Thus, the light-emitting device 70 can be easily used as a light source for illumination or the like.

According to the fifth embodiment, further, light parallelized perpendicularly to a light-emitting surface can be obtained through the p-type contact layers 11 or the metal layers 34 functioning as two-dimensional photonic crystals similarly to the first or second embodiment, whereby light extraction efficiency can be improved and the parallelized light can be diffused through the plano-concave lenses 72a.

The remaining effects of the fifth embodiment are similar to those of the aforementioned first or second embodiment.

Sixth Embodiment

Figure 10:
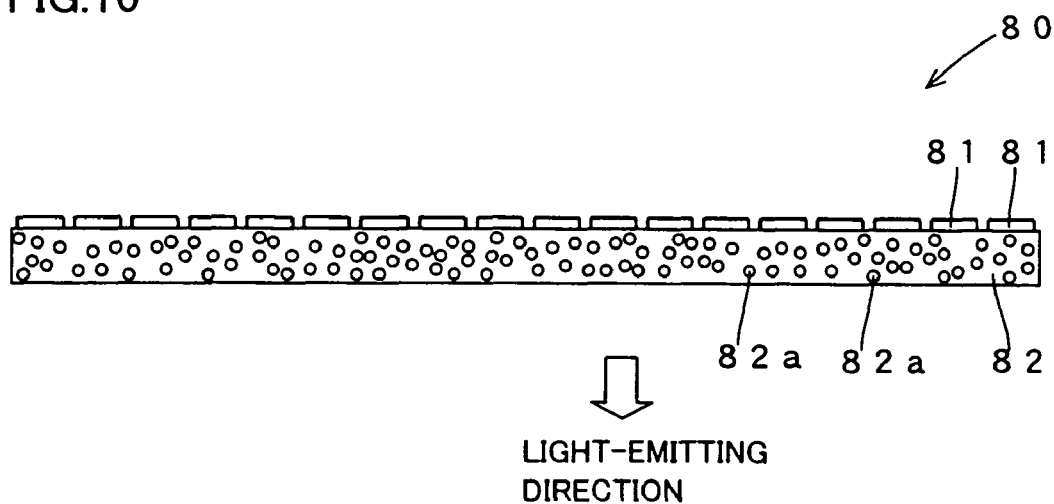
FIG. 10 is a sectional view for illustrating the structure of a light-emitting device according to a sixth embodiment of the present invention.

Referring to FIG. 10, a light-emitting device 80 according to a sixth embodiment of the present invention employs a diffusion sheet 82 consisting of a translucent film dispersively containing a light diffusing agent 82a consisting of transparent particulates.

According to the sixth embodiment, a transparent electrode of ITO is formed on the surface of the translucent diffusion sheet 82, as shown in FIG. 10. A plurality of light-emitting diodes 81 are arranged on the surface of the transparent electrode formed on the diffusion sheet 82 in the form of a matrix (array) in plane through an ohmic electrode of metal. In this case, light-emitting surfaces of the light-emitting diodes 81 are bonded to the surface of the diffusion sheet 82. Each light-emitting diode 81 has a structure obtained by removing a plano-concave lens from a light-emitting diode similar to that according to the first or third embodiment shown in FIG. 1 or 3. In other words, each light-emitting diode 81 of the light-emitting device 60 according to the sixth embodiment includes a p-type contact layer 11 (see FIG. 1) or a metal layer 34 (see FIG. 3) functioning as a two-dimensional photonic crystal having a dielectric constant periodically modulated with respect to the in-plane direction. Thus, the light-emitting diode 81 emits light parallelized perpendicularly to the light-emitting surface, thereby improving light extraction efficiency.

According to the sixth embodiment, the light diffusing agent 82a consisting of substantially spherical particulates of about 1 µm to about 20 µm in grain size is added into the diffusion sheet 82 constituting of glass or transparent plastic. This light diffusing agent 82a consists of an inorganic material such as $SiN_x$, $TiO_2$ or $Al_2O_3$ or an organic material such as polymethyl methacrylate, polyacrylonitrile, polyester, silicone, polyethylene, epoxy, a melamine-formaldehyde condensate, a benzoguanamine-formaldehyde condensate or a melamine-benzoguanamine-formaldehyde condensate. When the diffusion sheet 82 is constituted of a transparent plastic film and the light diffusing agent 82a is constituted of a melamine-benzoguanamine-formaldehyde condensate, for example, the weight ratio of the plastic film to the melamine-benzoguanamine-formaldehyde condensate is about 30:70.

In the light-emitting device 80 according to the sixth embodiment, as hereinabove described, the light-emitting diodes 81 are so two-dimensionally (planarly) arranged in the form of an array (matrix) that the sizes of regions emitting light can be increased. Thus, the light-emitting device 80 can be easily used as a light source for illumination or the like.

According to the sixth embodiment, further, the light-emitting surfaces of the light-emitting diodes 81 are bonded to the diffusion sheet 82 containing the light diffusing agent 82a so that the light emitted from the light-emitting diodes 81 arranged in the form of a matrix can be easily diffused.

The remaining effects of the sixth embodiment are similar to those of the aforementioned first or second embodiment.

Seventh Embodiment

Figure 11:
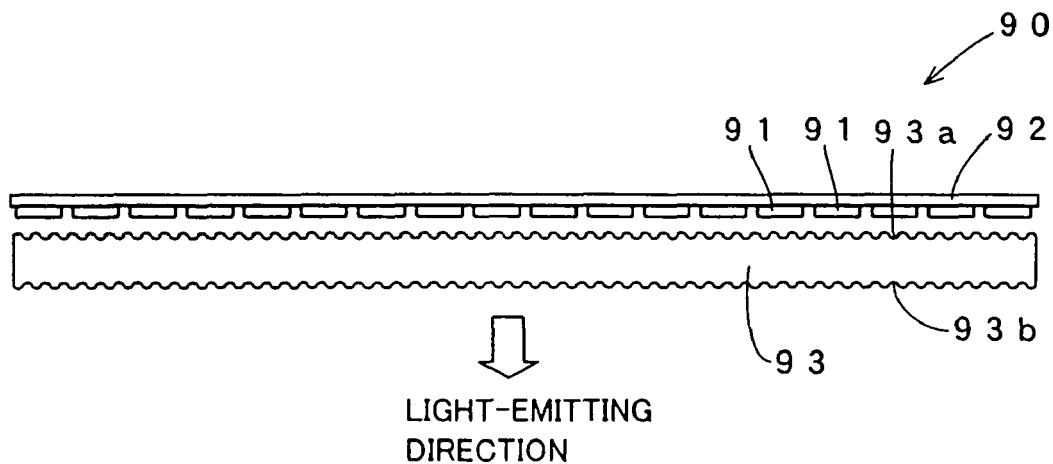
FIG. 11 is a sectional view for illustrating the structure of a light-emitting device according to a seventh embodiment of the present invention.

Referring to FIG. 11, a light-emitting device 90 according to a seventh embodiment of the present invention employs a diffusion sheet 93 formed with fine corrugation 93a and 93b on the front and back surfaces thereof respectively as a member diffusing light emitted from light-emitting diodes 91, dissimilarly to the aforementioned sixth embodiment.

According to the seventh embodiment, the fine corrugation 93a and 93b are formed on the front and back surfaces of the translucent diffusion sheet 93 consisting of a glass sheet or a transparent plastic film, as shown in FIG. 11. In the fine corrugation 93a and 93b, the pitch (interval) between adjacent recess portions is set to about 200 nm to about 2000 nm or to about 2 μm to about 100 μm. When the pitch (interval) between the adjacent recess portions is about 200 nm to about 2000 nm, this interval corresponds to a value equivalent to or several times the emission wavelength, whereby the fine corrugation 93a and 93b diffuse light by a diffraction effect. When the pitch (interval) between the adjacent recess portions is about 2 μm to about 100 μm, the corrugation 93a and 93b refract light thereby diffusing the light.

A plurality of light-emitting diodes 91 are arranged on the surface of a support plate 92 consisting of a material such as Al having high reflectance and excellent heat radiability in the form of a matrix (array) in plane. In this case, surfaces of the light-emitting diodes 91 opposite to the light-emitting surfaces are bonded to the surface of the support plate 92. The diffusion sheet 93 is arranged at a prescribed interval from the light-emitting diodes 91, to be opposed to the light-emitting surfaces of the light-emitting diodes 91 bonded to the surface of the support plate 92.

Each light-emitting diode 91 has a structure obtained by removing a plano-concave lens 50 from a light-emitting diode similar to that according to the first or third embodiment shown in FIG. 1 or 3. In other words, each light-emitting diode 91 of the light-emitting device 90 according to the seventh embodiment includes a p-type contact layer 11 (see FIG. 1) or a metal layer 34 (see FIG. 3) functioning as a two-dimensional photonic crystal having a dielectric constant periodically modulated with respect to the in-plane direction. Thus, the light-emitting diode 91 emits light parallelized perpendicularly to the light-emitting surface, thereby improving light extraction efficiency.

In the light-emitting device 90 according to the seventh embodiment, as hereinabove described, the light-emitting diodes 91 are so two-dimensionally (planarly) arranged in the form of an array (matrix) that the sizes of regions for emitting light can be increased. Thus, the light-emitting device 90 can be easily used as a light source for illumination or the like.

According to the seventh embodiment, further, the light-diffusing device 90 provided with the diffusion sheet 93 having the fine corrugation 93a and 93b on the front and back surfaces thereof can easily diffuse the light emitted from the light-emitting diodes 91 arranged in the form of a matrix.

The remaining effects of the seventh embodiment are similar to those of the aforementioned first or second embodiment.

Eighth Embodiment

Figure 12:
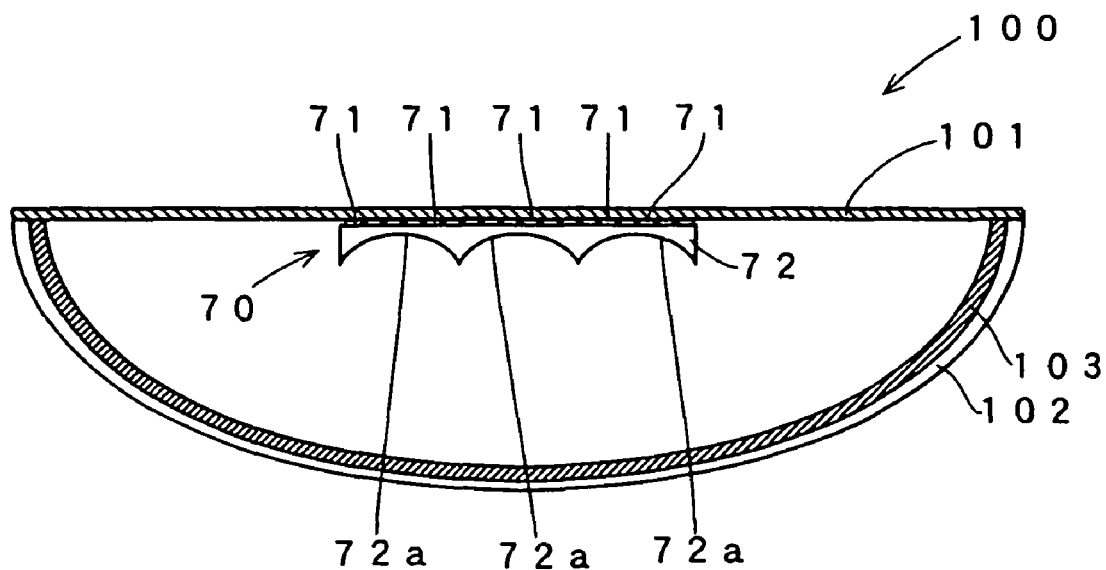
FIG. 12 is a sectional view for illustrating the structure of an illuminator employing a light-emitting device according to an eighth embodiment of the present invention.
Figure 13:
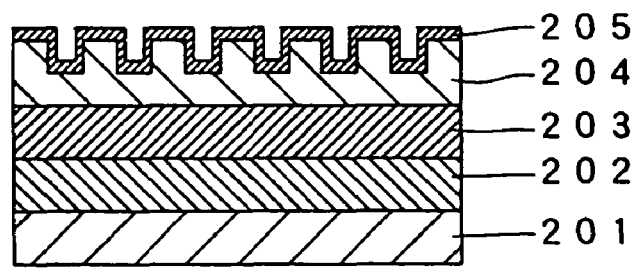
FIG. 13 is a sectional view for illustrating the structure of a light-emitting diode (light-emitting device) having a photonic crystal mounted on a light-emitting surface.

Referring to FIG. 12, an eighth embodiment of the present invention is described with reference to an illuminator 100 employing a light-emitting device 70 similar to that according to the aforementioned fifth embodiment.

In the illuminator 100 according to the eighth embodiment, the light-emitting device 70 having plano-concave lenses 72a and light-emitting diodes 71, similar to those according to the aforementioned fifth embodiment, two-dimensionally (planarly) arranged in the form of an array (matrix) is mounted on the surface of a reflector 101 of Al also serving as a radiator plate, as shown in FIG. 12. More specifically, a surface of the light-emitting device 70 opposite to light-emitting surfaces of the light-emitting diodes 71 is mounted on the reflector 101. A concave glass plate 102 is mounted to enclose the light-emitting device 70. A fluorescent layer 103 for white illumination is formed on the inner side of the concave glass plate 102.

The fluorescent layer 103 for white illumination is formed by mixing fluorescent materials of four emission colors of blue, green, red and yellow, for example, with each other. In this case, the blue fluorescent material is prepared from $BaMgAl_{17}O_{10}$:Eu or $(Sr,Ca,Ba,Mg)_{10}(PO_4)_6Cl_2$:Eu, and the green fluorescent material is prepared from ZnS:Cu,Al. The red fluorescent material is prepared from $Y_2O_2S$:Eu, and the yellow fluorescent material is prepared from $(Y,Gd)_3Al_5O_{12}$:Ce. Terminals (not shown) for exciting the light-emitting device 70 are set on the reflector 101.

In the illuminator 100 according to the eighth embodiment, as hereinabove described, the light-emitting diodes 71 including the p-type contact layers 11 or the metal layers 34 functioning as two-dimensional photonic crystals are so employed that light parallelized perpendicularly to the light-emitting surfaces can be obtained, whereby light extraction efficiency of the light-emitting diodes 71 can be improved. Further, the plano-concave lenses 72a can diffuse the parallel light emitted from the light-emitting diodes 71, whereby diffused light suitable for illumination can be obtained. In addition, the plano-concave lenses 72a and the light-emitting diodes 71 are two-dimensionally (planarly) arranged on the light-emitting device 70 in the form of an array (matrix) so that the sizes of regions emitting light can be increased, whereby brightness necessary for the illuminator 100 can be easily obtained.

Although the present invention has been described and illustrated in detail, it is clearly understood that the same is by way of illustration and example only and is not to be taken by way of limitation, the spirit and scope of the present invention being limited only by the terms of the appended claims.

For example, the plano-concave lens(es) 50 or 72a, the convex mirror 65, the diffusion sheet 82 including the light diffusing agent 82a or the diffusing sheet 93 having the fine corrugation 93a and 93b is employed as the member(s) (means) diffusing the light emitted from the light-emitting diode(s) according to the present invention in each of the aforementioned embodiments, the present invention is not restricted to this but a lens, a mirror or a diffraction grating having a different shape may alternatively be employed as the member (means) diffusing emitted light.

While each of the aforementioned embodiments employs the photonic crystal(s) as the portion(s) having the periodically modulated dielectric constant according to the present invention, the present invention is not restricted to this but a structure other than the photonic crystal may alternatively be employed as the portion having the periodically modulated dielectric constant.

While in the light-emitting device in the aforementioned fourth embodiment a single convex mirror is arranged to a single light-emitting diode, the present invention is not restricted to this but the convex mirror may alternatively be arranged at ratio of one to a plurality of light-emitting diodes or a plurality of convex mirrors and light-emitting diodes may alternatively be arranged in the form of an array (matrix).

While the light-emitting device 70 similar to that according to the fifth embodiment is built into the illuminator 100 according to the eighth embodiment, the present invention is not restricted to this but a light-emitting device similar to that according to the sixth or seventh embodiment may alternatively be built into the illuminator 100 according to the eighth embodiment.

In each of the first and second embodiments, a transparent electrode may be formed on the planar side of the plano-concave lens 50 of an insulator such as glass, for welding the light-emitting diode to this plane.

What is claimed is:

1. An illuminator comprising a light-emitting device including:
   a light-emitting diode;
   a member provided on the side of a light-emitting surface of said light-emitting diode for diffusing light emitted from said light-emitting diode; and
   a reflector, wherein
   said light-emitting diode has an emission layer and said emission layer is formed substantially parallel to said light-emitting surface,
   said light emitted from said light-emitting diode is parallelized perpendicularly to said light-emitting surface, and
   said light-emitting device is mounted on the reflector.

2. The illuminator according to claim 1, further comprising a fluorescent body arranged at a prescribed interval from said light-emitting device for converting light emitted from said light-emitting device to white light.

3. The illuminator according to claim 2, wherein
   said fluorescent body is formed by mixing fluorescent materials having a plurality of colors with each other.

4. The illuminator according to claim 1, wherein
   a plurality of said light-emitting diodes constituting said light-emitting device are arranged in the form of a matrix in plane.

5. The illuminator according to claim 4, wherein
   said member diffusing emitted said light includes a lens, and a plurality of said lenses are arranged in the form of a matrix in plane.

6. The illuminator according to claim 4, wherein
   said member for diffusing light from said light-emitting diode consists of lens arranged at a ratio of one to a plurality of light-emitting diodes.

* * * * *